United States Patent
Chen et al.

(10) Patent No.: US 11,626,549 B2
(45) Date of Patent: Apr. 11, 2023

(54) MICRO LIGHT-EMITTING DEVICE DISPLAY APPARATUS HAVING BUMP

(71) Applicant: PlayNitride Display Co., Ltd., MiaoLi County (TW)

(72) Inventors: Yi-Ching Chen, MiaoLi County (TW); Yi-Chun Shih, MiaoLi County (TW); Pei-Hsin Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 76 days.

(21) Appl. No.: 17/002,790

(22) Filed: Aug. 26, 2020

(65) Prior Publication Data
US 2021/0328119 A1    Oct. 21, 2021

(30) Foreign Application Priority Data

Apr. 16, 2020 (TW) .................................. 109112755

(51) Int. Cl.
*H01L 33/62* (2010.01)
*H01L 33/38* (2010.01)
(Continued)

(52) U.S. Cl.
CPC .............. *H01L 33/62* (2013.01); *H01L 33/22* (2013.01); *H01L 33/382* (2013.01); *H01L 33/486* (2013.01)

(58) Field of Classification Search
CPC ....... H01L 27/156; H01L 33/62; H01L 33/22; H01L 33/382; H01L 33/486
(Continued)

(56) References Cited

U.S. PATENT DOCUMENTS 6,324,754 B1 * 12/2001 DiStefano .............. H05K 1/111
361/764
10,727,385 B2 * 7/2020 Wakaki ................... H01L 33/62
(Continued)

FOREIGN PATENT DOCUMENTS

CN          101221939          7/2008
CN          102651357          8/2012
(Continued)

OTHER PUBLICATIONS

"Office Action of Taiwan Counterpart Application", dated Nov. 6, 2020, p. 1-p. 4.
(Continued)

*Primary Examiner* — Didarul A Mazumder
(74) *Attorney, Agent, or Firm* — JCIPRNET

(57) ABSTRACT

A micro light-emitting device display apparatus includes a circuit substrate, at least one micro light-emitting device, and at least one conductive bump. The circuit substrate includes at least one pad. The micro light-emitting device is disposed on the circuit substrate and includes at least one electrode. At least one of the pad and the electrode has at least one closed opening. The conductive bump is disposed between the circuit substrate and the micro light-emitting device. The conductive bump extends into the closed opening and defines at least one void with the closed opening. The electrode of the micro light-emitting device is electrically connected to the pad of the circuit substrate with the conductive bump.

8 Claims, 4 Drawing Sheets

(51) Int. Cl.
*H01L 33/22* (2010.01)
*H01L 33/48* (2010.01)

(58) Field of Classification Search
USPC .............................................. 257/79; 438/22
See application file for complete search history.

(56) References Cited

U.S. PATENT DOCUMENTS

| | | | | |
|---|---|---|---|---|
| 10,971,890 | B2* | 4/2021 | Zou | H01S 5/0216 |
| 2002/0125043 | A1* | 9/2002 | Yoshida | H05K 1/111 |
| | | | | 174/250 |
| 2005/0077531 | A1* | 4/2005 | Kim | H01L 33/505 |
| | | | | 257/98 |
| 2010/0051995 | A1* | 3/2010 | Katsuno | H01L 33/10 |
| | | | | 257/E33.056 |
| 2014/0355251 | A1 | 12/2014 | Kahrs et al. | |
| 2015/0115440 | A1* | 4/2015 | Higuchi | H01L 24/13 |
| | | | | 257/737 |
| 2015/0235984 | A1* | 8/2015 | Aoyagi | H01L 23/49811 |
| | | | | 228/1.1 |
| 2016/0163663 | A1 | 6/2016 | Kim et al. | |
| 2016/0307861 | A1* | 10/2016 | Lin | H01L 24/05 |
| 2017/0133567 | A1* | 5/2017 | Fukasawa | H01L 33/507 |
| 2017/0229430 | A1 | 8/2017 | Lai et al. | |
| 2019/0006559 | A1 | 1/2019 | Lai et al. | |
| 2019/0088820 | A1 | 3/2019 | Danesh et al. | |
| 2019/0341525 | A1 | 11/2019 | Danesh et al. | |
| 2019/0386173 | A1 | 12/2019 | Chen et al. | |
| 2019/0393392 | A1 | 12/2019 | Choi et al. | |
| 2020/0028028 | A1 | 1/2020 | Tsai et al. | |
| 2020/0035748 | A1* | 1/2020 | Xia | H01L 27/156 |
| 2020/0075805 | A1 | 3/2020 | Lai et al. | |

FOREIGN PATENT DOCUMENTS

| | | |
|---|---|---|
| CN | 109216516 | 1/2019 |
| CN | 109671732 | 4/2019 |
| CN | 109671821 | 4/2019 |
| CN | 109686752 | 4/2019 |
| CN | 110416248 | 11/2019 |
| CN | 110783443 | 2/2020 |
| TW | 201828509 | 8/2018 |
| TW | 201841392 | 11/2018 |
| TW | 201903988 | 1/2019 |
| TW | 201906200 | 2/2019 |
| TW | 201914061 | 4/2019 |
| TW | 201919257 | 5/2019 |
| TW | 201935719 | 9/2019 |
| WO | 2016018109 | 2/2016 |
| WO | 2019194446 | 10/2019 |

OTHER PUBLICATIONS

"Notice of allowance of China Counterpart Application", dated Jul. 6, 2022, p. 1-p. 5.

"Office Action of China Counterpart Application", dated Apr. 6, 2022, p. 1-p. 12.

* cited by examiner

MICRO LIGHT-EMITTING DEVICE DISPLAY APPARATUS HAVING BUMP

CROSS-REFERENCE TO RELATED APPLICATION

This application claims the priority benefit of Taiwan application no. 109112755, filed on Apr. 16, 2020. The entirety of the above-mentioned patent application is hereby incorporated by reference herein and made a part of this specification.

BACKGROUND OF THE INVENTION

1. Field of the Invention

The invention relates to a display apparatus, and in particular, to a micro light-emitting device display apparatus.

2. Description of Related Art

A micro light-emitting diode display has advantages such as low power consumption, high brightness, high color saturation, fast response and power saving, and further has advantages such as good material stability and no image sticking. Therefore, the development of a display technology for the micro light-emitting diode display has attracted much attention.

As far as a manufacturing process is concerned, in a process of transferring a micro light-emitting diode from a growth substrate to a driving circuit substrate, the micro light-emitting diode needs to be heated and pressurized, so that the micro light-emitting diode is electrically bonded to the driving circuit substrate. However, in this process of transferring and bonding, due to a small size of the micro light-emitting diode, a distance between two adjacent electrodes is also small. The electrodes of the micro light-emitting diode and the pads on the driving circuit board are prone to a short circuit if overflow occurs due to misalignment or melting of bumps, this leads low reliability of the micro light-emitting diode displayer.

SUMMARY OF THE INVENTION

The present disclosure provides a micro light-emitting device display apparatus with higher reliability.

The micro light-emitting device display apparatus includes a circuit substrate, at least one micro light-emitting device, and at least one conductive bump. The circuit substrate includes at least one pad. The micro light-emitting device is disposed on the circuit substrate and includes at least one electrode. At least one of the pad and the electrode has at least one closed opening. The conductive bump is disposed between the circuit substrate and the micro light-emitting device. The conductive bump extends into the closed opening and defines at least one void with the closed opening. The electrode of the micro light-emitting device is electrically connected to the pad of the circuit substrate with the conductive bump.

In an embodiment of the present disclosure, the circuit substrate has a surface, and the circuit substrate includes a plurality of pads. At least one of the pads has the closed opening exposing a part of the surface of the circuit substrate.

In an embodiment of the present disclosure, an orthographic projection of the conductive bump on the circuit substrate completely overlaps an orthographic projection of the closed opening on the circuit substrate.

In an embodiment of the present disclosure, an orthographic projection of the conductive bump on the circuit substrate partially overlaps an orthographic projection of the closed opening on the circuit substrate.

In an embodiment of the present disclosure, the micro light-emitting device further includes an epitaxial structure layer and an insulating layer. The epitaxial structure layer includes a first-type semiconductor layer, a light-emitting layer, and a second-type semiconductor layer and has a surface and a through hole. The electrode is disposed on the surface, and the through hole sequentially penetrates the second-type semiconductor layer, the light-emitting layer, and a part of the first-type semiconductor layer. The insulating layer is disposed on the surface and an inner wall of the through hole. The electrode includes a first electrode and a second electrode. The first electrode is filled into the through hole and electrically connected to the first-type semiconductor layer. The second electrode passes through the insulating layer and is electrically connected to the second-type semiconductor layer.

In an embodiment of the present disclosure, the second electrode has the closed opening, the closed opening is a groove.

In an embodiment of the present disclosure, the micro light-emitting device further includes an epitaxial structure layer and an insulating layer. The epitaxial structure layer includes a first-type semiconductor layer, a light-emitting layer, and a second-type semiconductor layer. The first-type semiconductor layer has an upper surface, and the second-type semiconductor layer has a lower surface. The insulating layer is disposed on the lower surface, where the electrode passes through the insulating layer and is electrically connected to the second-type semiconductor layer.

In an embodiment of the present disclosure, the micro light-emitting device display apparatus further includes a plurality of the micro light-emitting devices, a flat layer and a common electrode. The flat layer is disposed on the circuit substrate and located between the micro light-emitting devices. The common electrode is extendedly disposed from the upper surface of the first-type semiconductor layer of one of the micro light-emitting devices along the flat layer to the upper surface of the first-type semiconductor layer of another of the micro light-emitting devices, and is electrically connected to the first-type semiconductor layer.

In an embodiment of the present disclosure, the circuit substrate has a surface and a plurality of pads. At least one of the pads has the closed opening, and the closed opening exposes a part of the surface of the circuit substrate.

In an embodiment of the invention, the closed opening is in shape of polygon, circle, ellipse, or an irregular shape.

In view of the above, in a design of the micro light-emitting device display apparatus of the present disclosure, at least one of the pad and the electrode has at least one of the closed opening, and the conductive bump extends into the closed opening and defines the void with the closed opening. Therefore, when the electrode of the micro light-emitting device is electrically connected to the pad of the circuit substrate with the conductive bump, there is a larger contact area between the conductive bump and the pad or the electrode, so that the micro light-emitting device display apparatus of the present disclosure is with higher electrical reliability.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Embodiments of the present disclosure describe a structure of micro device (such as a micro light-emitting diode (LED) or a microchip) which is ready to be picked up and transferred to a receiving substrate. The receiving substrate may be, for example, a display substrate, a light-emitting substrate, a substrate with a functional device such as a transistor or an integrated circuit (IC), or any other substrates with a wiring, but is not limited thereto. Although some embodiments of the present disclosure are specific to describing a micro LED including a p-n diode, it should be understood that the embodiments of the present disclosure are not limited thereto. Some embodiments may also be applied to other micro devices, and those devices, according to such manner, may be designed to control execution of predetermined electronic function (such as a diode, a transistor, and an IC) or photonic function (an LED and laser).

Figure 1A:
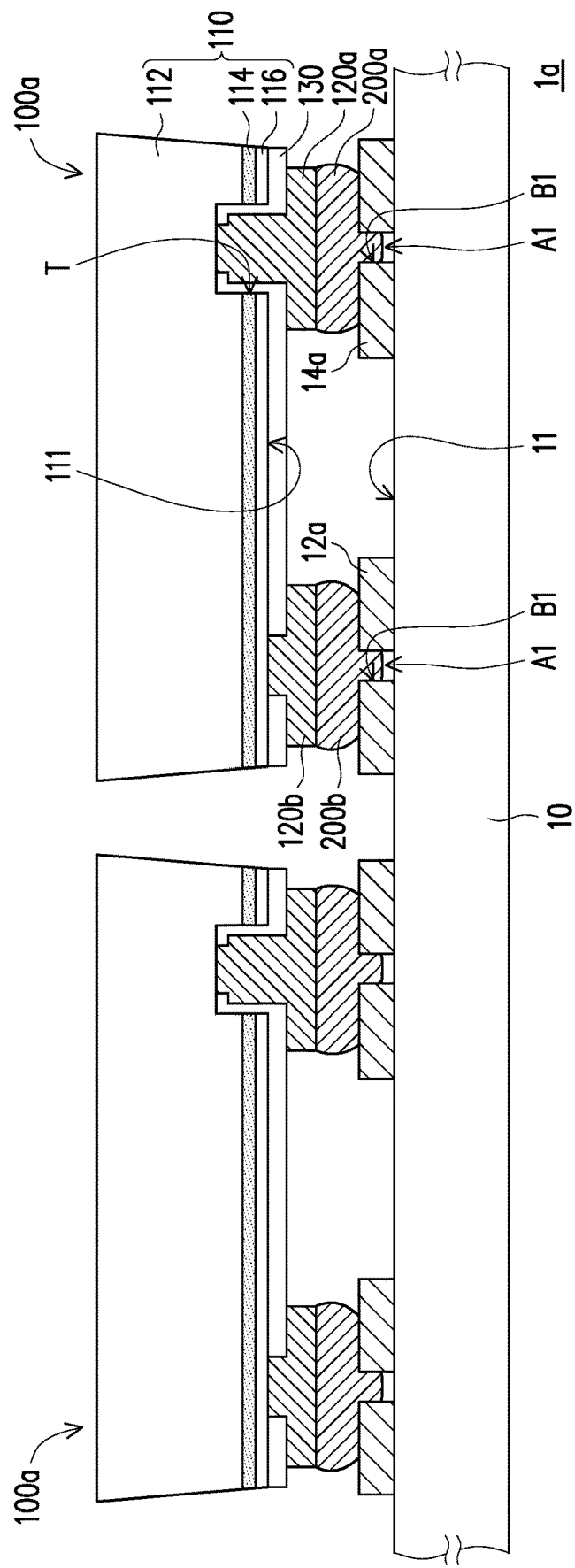
FIG. 1A is a schematic cross-sectional view of a micro light-emitting device display apparatus according to an embodiment of the present disclosure.
Figure 1B:
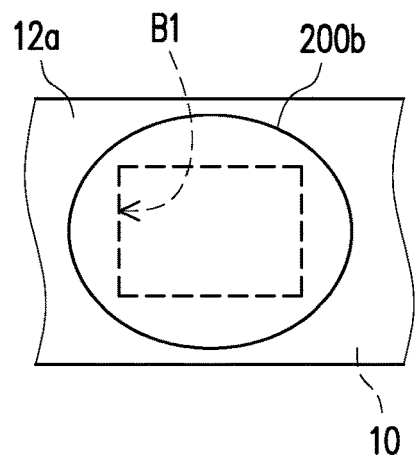
FIG. 1B is a partial schematic top view of a conductive bump and a pad in FIG. 1A.

FIG. 1A is a schematic cross-sectional view of a micro light-emitting device display apparatus according to an embodiment of the present disclosure. FIG. 1B is a partial schematic top view of a conductive bump and a pad in FIG. 1A. Referring to FIG. 1A and FIG. 1B, in the present embodiment, a micro light-emitting device display apparatus 1a includes a circuit substrate 10, at least one micro light-emitting device (two micro light-emitting devices 100a are schematically shown), and at least one conductive bump (a plurality of conductive bumps 200a, 200b are schematically shown). The circuit substrate 10 includes at least one pad (a plurality of pads 12a, 14a are schematically shown). The micro light-emitting device 100a is disposed on the circuit substrate 10 and each of the micro light-emitting devices 100a includes at least one electrode (two electrodes 120a, 120b are schematically shown). In particular, at least one of the pads 12a, 14a and the electrodes 120a, 120b has at least one closed opening B1. Herein, as shown in FIG. 1A and FIG. 1B, the pads 12a, 14a respectively have one closed opening B1, but are not limited thereto. Preferably, the closed opening B1 may be formed through a patterning process. The conductive bumps 200a, 200b are disposed between the circuit substrate 10 and the micro light-emitting device 100a. In particular, the conductive bumps 200a, 200b overlap with the corresponding closed openings B1 and extend into the closed openings B1, wherein each conductive bump 200a, 200b and each corresponding closed opening B1 define at least one void (a void A1 is schematically shown). In other words, the conductive bumps 200a, 200b are respectively in contact with the pads 12a, 14a to form a part of a side wall of the closed opening B1, and do not completely fill the closed opening B1, but form the void A1 with the closed opening B1. Thereby, a contact area of the conductive bumps 200a, 200b and the pads 12a, 14a can be effectively increased. In particular, the void A1 may be an air hole or a vacuum hole, which is not limited herein. Herein, the electrodes 120a, 120b of the micro light-emitting device 100a are electrically connected to the pads 12a, 14a of the circuit substrate 10 with the conductive bumps 200a, 200b.

Still further, the circuit substrate 10 in the present embodiment has a surface 11, and the pads 12a, 14a are disposed on the surface 11, the closed opening B1 of the pad 12a exposes a part of the surface 11 of the circuit substrate 10. Herein, the circuit substrate 10 is, for example, a complementary metal-oxide-semiconductor (CMOS) substrate, a liquid crystal on silicon (LCOS) substrate, a thin film transistor (TFT) substrate, or other substrates with working circuits, which is not limited herein.

In addition, the micro light-emitting device 100a in the present embodiment further includes an epitaxial structure layer 110 and an insulating layer 130. The epitaxial structure layer 110 includes a first-type semiconductor layer 112, a light-emitting layer 114, a second-type semiconductor layer 116, a surface 111, and a through hole T. The electrodes 120a, 120b are disposed on the surface 111, and the through hole T sequentially penetrates the second-type semiconductor layer 116, the light-emitting layer 114, and a part of the first-type semiconductor layer 112. The insulating layer 130 is disposed on the surface 111 and an inner wall of the through hole T. The electrode 120a (considered as a first electrode) is filled into the through hole T and is electrically connected to the first-type semiconductor layer 112. The electrode 120b (considered as a second electrode) passes through the insulating layer 130 and is electrically connected to the second-type semiconductor layer 116. Herein, the micro light-emitting device 100a in the present embodiment is embodied as a flip-chip micro light-emitting diode.

Figure 1C:
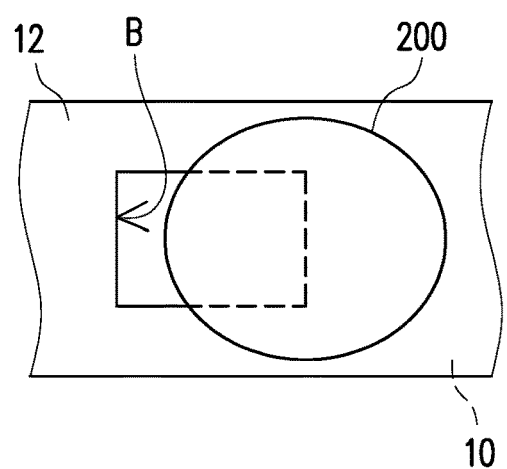
FIG. 1C is a schematic top view of a conductive bump and a pad according to another embodiment.

In addition, as shown in FIG. 1B, an orthographic projection of the conductive bump 200b in the present embodiment on the circuit substrate 10 completely overlaps an orthographic projection of the closed opening B1 of the pad 12a on the circuit substrate 10, but is not limited thereto. In other embodiments, referring to FIG. 1C, an orthographic projection of the conductive bump 200 on the circuit substrate 10 partially overlaps an orthographic projection of the closed opening B of the pad 12 on the circuit substrate 10. In other words, the conductive bump 200 does not completely cover the closed opening B, but is still in contact with a part of the side wall of the closed opening B. Herein, the closed openings B, B1 are embodied as through holes penetrating the pads 12, 12a, and the closed openings B, B1 are in shape of polygon, for example, such as rectangle, but are not limited thereto. In other embodiments not shown, the shape of the closed opening B, B1 may be a circle, an ellipse, or an irregular shape.

Figure 1D:
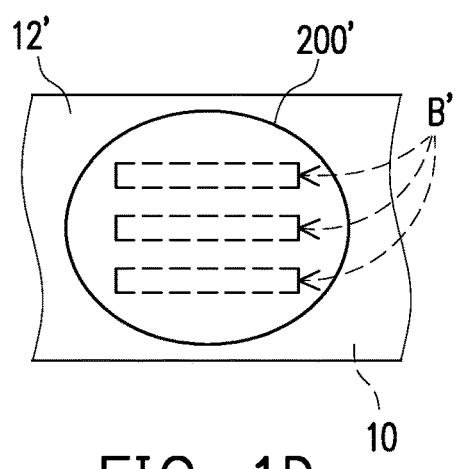
FIG. 1D is a schematic top view of a conductive bump and a pad according to another embodiment.

In another embodiment, referring to FIG. 1D, each conductive bump 200' may correspond to a plurality of closed openings B', and an orthographic projection of the conductive bump 200' on the circuit substrate 10 completely overlaps an orthographic projection of the closed openings B' of the pad 12' on the circuit substrate 10. In other words, each pad 12' has the plurality of closed openings B'. In addition, the present embodiment is similar to the embodiment of FIG. 1A, where the conductive bump 200' covers the closed openings B1' and may define at least one void with the closed openings B1' (referring to the void A1 in FIG. 1A).

In short, in the design of the micro light-emitting device display apparatus 1a in the present embodiment, the pads 12a, 14a have the closed openings B1, respectively, and the conductive bumps 200a, 200b extend into the closed openings B1 and define the voids A1 with the closed openings B1 without filling the closed openings B1. Therefore, when the electrodes 120a, 120b of the micro light-emitting device 100a are electrically connected to the pads 12a, 14a of the circuit substrate 10 with the conductive bumps 200a, 200b, there may be a larger contact area between the conductive bumps 200a, 200b and the pads 12a, 14a. Further, due to hot pressing process, the conductive bumps 200a, 200b partially formed in a molten state on the surface, and therefore can be accommodated in the closed openings B1. In this way, a short-circuit phenomenon that occurs to the electrode of the conventional micro light-emitting diode and the pad on the driving circuit substrate can be avoided, and bonding connectivity can be reinforced. Therefore, the micro light-emitting device display apparatus 1a in the present embodiment is with higher electrical reliability.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 2:
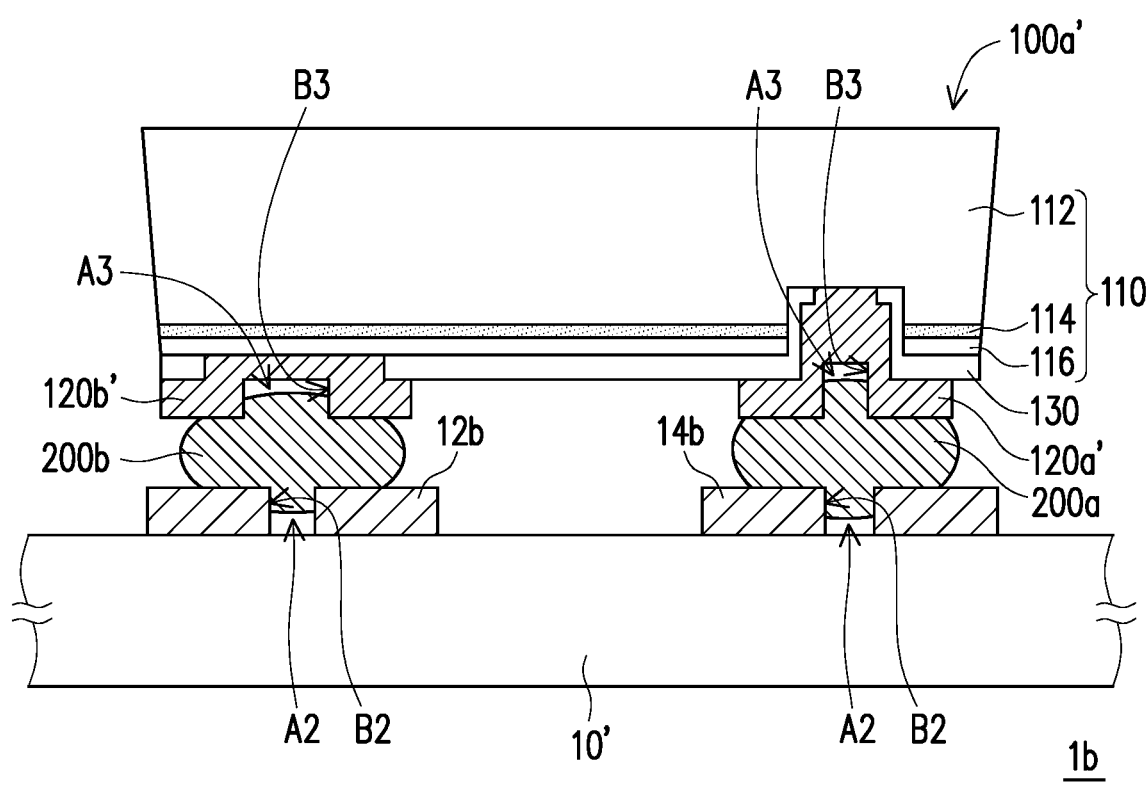
FIG. 2 is a schematic cross-sectional view of a micro light-emitting device display apparatus according to another embodiment of the present disclosure.

FIG. 2 is a schematic cross-sectional view of a micro light-emitting device display apparatus according to another embodiment of the present disclosure. Referring to FIG. 1A and FIG. 2 simultaneously, a micro light-emitting device display apparatus 1b in the present embodiment is similar to the micro light-emitting device display apparatus 1a of FIG. 1A, and the difference between the two is that in the present embodiment, except that pads 12b, 14b of a circuit substrate 10' in the present embodiment have closed openings B2, respectively, and electrodes 120a', 120b' of a micro light-emitting device 100a' also have a closed openings B3, respectively, and the closed openings B3 are embodied as grooves.

In the design of the micro light-emitting device display apparatus 1b in the present embodiment, the pads 12b, 14b have the closed openings B2, respectively, and the electrodes 120a', 120b' have the closed openings B3, respectively. Therefore, when a hot pressing process is performed to electrically connect the electrodes 120a, 120b 'of the micro light-emitting device 100a' to the pads 12b, 14b of the circuit substrate 10' with the conductive bumps 200a, 200b, the conductive bumps 200a, 200b may be extendedly disposed in the closed openings B2 of the pads 12b, 14b and define the voids A2 with the closed openings B2, and the conductive bumps 200a, 200b may be extendedly disposed in the closed openings B3 of the electrodes 120a', 120b' and define the voids A3 with the closed openings B3. Thereby, there may be a larger contact area between the conductive bumps 200a, 200b and the pads 12b, 14b and between the conductive bumps 200a, 200b and the electrodes 120a', 120b', so that the micro light-emitting device display apparatus 1b in the present embodiment is with higher electrical reliability.

Figure 3:
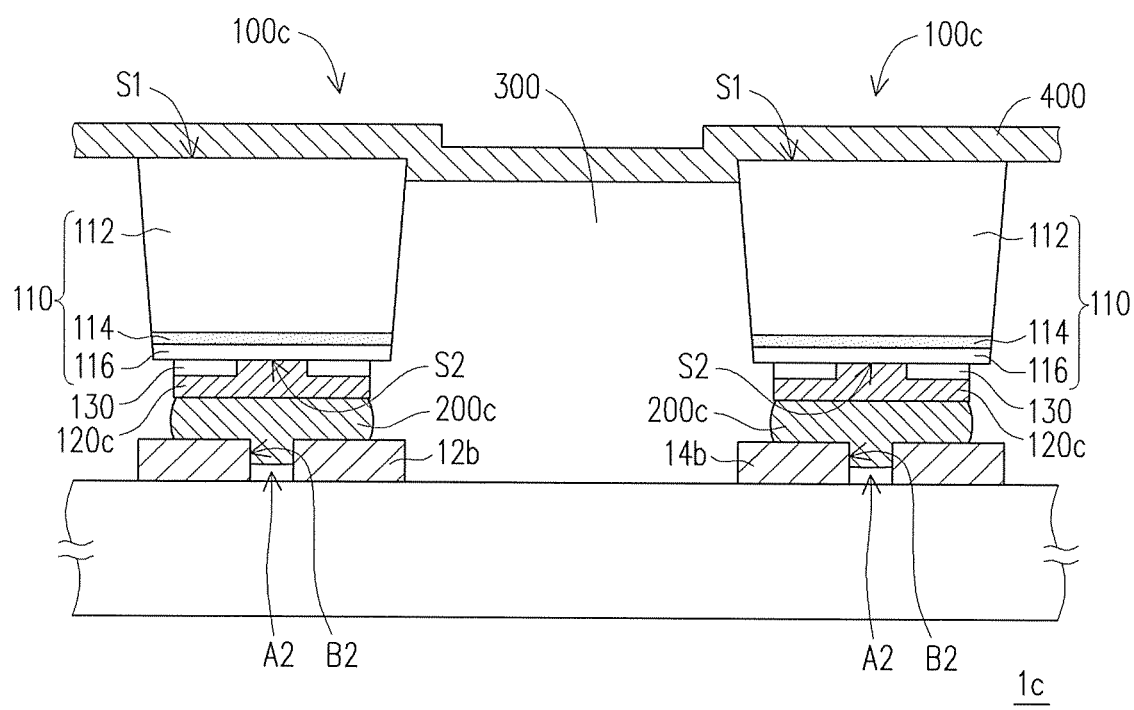
FIG. 3 is a schematic cross-sectional view of a micro light-emitting device display apparatus according to still another embodiment of the present disclosure.

FIG. 3 is a schematic cross-sectional view of a micro light-emitting device display apparatus according to still another embodiment of the present disclosure. Referring to FIG. 1A, FIG. 2 and FIG. 3 simultaneously, a micro light-emitting device display apparatus 1c in the present embodiment is similar to the micro light-emitting device display apparatus 1a of FIG. 1A, and a difference between the two is that in the present embodiment, except that the pads 12b, 14b of the circuit substrate 10' in the present embodiment have the closed opening B2, respectively, a structure of a micro light-emitting device 100c in the present embodiment is different from the structure of the micro light-emitting device 100a of FIG. 1A.

In detail, a first-type semiconductor layer 112 of the micro light-emitting device 100c in the present embodiment has an upper surface S1, and a second-type semiconductor layer 116 has a lower surface S2, an electrode 120c is disposed on the lower surface S2. The electrode 120c is electrically connected to the second-type semiconductor layer 116. Herein, an electrode structure of the micro light-emitting device 100c has only one electrode 120c, and the micro light-emitting device 100c is embodied as a vertical micro light-emitting diode.

Still further, the micro light-emitting device display apparatus 1c in the present embodiment includes a plurality of micro light-emitting devices (two micro light-emitting devices 100c are schematically shown), a flat layer 300, and a common electrode 400. The flat layer 300 is disposed on the circuit substrate 10 and is located between the micro light-emitting devices 100c. The common electrode 400 is extendedly disposed from the upper surface S1 of the first-type semiconductor layer 112 of one of the two micro light-emitting devices 100c along the flat layer 300 to the upper surface S1 of the first-type semiconductor layer 112 of another micro light-emitting devices 100c, and is electrically connected to the first-type semiconductor layer 112. Herein, the common electrode 400 is, for example, a light-transmitting conductive material, so that the micro light-emitting device 100c can emit light from the common electrode 400.

In the design of the micro light-emitting device display apparatus 1c in the present embodiment, the pads 12b, 14b have the closed openings B2, respectively, and the conductive bump 200c extends into the closed openings B2 and defines the voids A2 with the closed openings B2. Therefore, when the electrodes 120c of the micro light-emitting devices 100c are electrically connected to the pads 12b, 14b of the circuit substrate 10' with the conductive bumps 200c, there is a larger contact area between the conductive bumps 200c and the pads 12b, 14b. Further, due to hot pressing process, the conductive bumps 200c formed in a molten state, and therefore can be accommodated in the closed openings B2. In this way, a short-circuit phenomenon that occurs to the electrode of the conventional micro light-emitting diode and the pad on the driving circuit substrate can be avoided. Therefore, the micro light-emitting device display apparatus 1c in the present embodiment is with higher electrical reliability.

In view of the above, in a design of the micro light-emitting device display apparatus in the present disclosure, at least one of the pad and the electrode has at least one closed opening, and the conductive bump extends into the closed opening and defines the void with the closed opening, where the closed opening may be the through hole or the groove, and the void may be the air hole or the vacuum hole. Therefore, when the electrode of the micro light-emitting device is electrically connected to the pad of the circuit substrate with the conductive bump, there is a larger contact area between the conductive bump and the pad or the electrode, so that the micro light-emitting device display apparatus in the present disclosure is with higher electrical reliability.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A micro light-emitting device display apparatus, comprising:
   a circuit substrate comprising at least one pad;
   at least one micro light-emitting device disposed on the circuit substrate and comprising at least one electrode, wherein the at least one pad and the at least one electrode respectively have a first closed opening and a second closed opening; and
   at least one conductive bump disposed between the circuit substrate and the at least one micro light-emitting device, wherein the at least one conductive bump extends into the first closed opening and second closed opening and defines a first void with the first closed opening and a second void with the second closed opening, and the at least one electrode of the at least one micro light-emitting device is electrically connected to the at least one pad of the circuit substrate with the at least one conductive bump,
   wherein the first void has a height less than a height of the at least one pad and the second void has a height less than a height of the at least one electrode,
   wherein an orthographic projection of the at least one conductive bump on the circuit substrate completely overlaps an orthographic projection of the first closed opening on the circuit substrate.

2. The micro light-emitting device display apparatus according to claim 1, wherein the circuit substrate has a surface, and the circuit substrate comprises a plurality of pads, at least one of the plurality of pads has the first closed opening exposing a part of the surface of the circuit substrate.

3. The micro light-emitting device display apparatus according to claim 1, wherein the at least one micro light-emitting device further comprises:
   an epitaxial structure layer comprising a first-type semiconductor layer, a light-emitting layer, and a second-type semiconductor layer and having a surface and a through hole, wherein the at least one electrode is disposed on the surface, and the through hole sequentially penetrates the second-type semiconductor layer, the light-emitting layer, and a part of the first-type semiconductor layer; and
   an insulating layer disposed on the surface and an inner wall of the through hole, wherein the at least one electrode comprises a first electrode and a second electrode, the first electrode is filled into the through hole and electrically connected to the first-type semiconductor layer, and the second electrode passes through the insulating layer and is electrically connected to the second-type semiconductor layer.

4. The micro light-emitting device display apparatus according to claim 3, wherein the second electrode has the at least one second closed opening, and the second closed opening is a groove.

5. The micro light-emitting device display apparatus according to claim 1, wherein the at least one micro light-emitting device further comprises:
   an epitaxial structure layer comprising a first-type semiconductor layer, a light-emitting layer, and a second-type semiconductor layer, the first-type semiconductor layer having an upper surface, and the second-type semiconductor layer having a lower surface; and
   an insulating layer disposed on the lower surface, wherein the at least one electrode passes through the insulating layer and is electrically connected to the second-type semiconductor layer.

6. The micro light-emitting device display apparatus according to claim 5, further comprising:
   a plurality of micro light-emitting devices;
   a flat layer disposed on the circuit substrate and located between the plurality of micro light-emitting devices; and
   a common electrode extendedly disposed from the upper surface of the first-type semiconductor layer of one of the plurality of micro light-emitting devices along the flat layer to the upper surface of the first-type semiconductor layer of another of the plurality of micro light-emitting devices, and electrically connected to the first-type semiconductor layer.

7. The micro light-emitting device display apparatus according to claim 5, wherein the circuit substrate has a surface and a plurality of pads, at least one of the plurality of pads comprises the first closed opening, and the first closed opening exposes a part of the surface of the circuit substrate.

8. The micro light-emitting device display apparatus according to 1, wherein the first closed opening and second closed opening comprise a shape of polygon, circle, ellipse, or irregular shape.

* * * * *